United States Patent [19]
Drohan

[11] Patent Number: 5,750,908
[45] Date of Patent: May 12, 1998

[54] TESTING SYSTEM WITH REAL TIME/OFF LINE FUNCTIONALITY ALLOCATION

[75] Inventor: William Drohan, Bedford, Mass.

[73] Assignee: ADE Corproation, Westwood, Mass.

[21] Appl. No.: 805,269

[22] Filed: Feb. 25, 1997

Related U.S. Application Data

[60] Provisional application No. 60/013,214, Feb. 26, 1996.

[51] Int. Cl.$^6$ ........................................... G01M 19/00
[52] U.S. Cl. .................. 73/865.9; 324/73.1; 364/468.15; 364/468.28; 364/579; 364/552
[58] Field of Search ........................... 73/865.9; 324/73.1, 324/765, 766, 767, 768, 769; 437/8; 29/703, 705; 259/571, 573; 364/468.01, 468.28, 468.15, 468.17, 478.01, 478.06, 478.11, 478.16, 478.18, 551.1, 552, 570, 579; 198/339.1, 341; 414/222

[56] References Cited

U.S. PATENT DOCUMENTS

| | | | |
|---|---|---|---|
| 4,750,141 | 6/1988 | Judell et al. | 364/550 |
| 4,755,746 | 7/1988 | Mallory et al. | 324/765 X |
| 4,803,634 | 2/1989 | Ohno et al. | 364/478.01 |
| 4,860,229 | 8/1989 | Abbe et al. | 364/563 |
| 4,876,658 | 10/1989 | Hass | 73/12.02 X |
| 5,111,402 | 5/1992 | Brooks et al. | 324/73.1 X |
| 5,257,206 | 10/1993 | Hanson | 364/150 X |
| 5,511,005 | 4/1996 | Abbe et al. | 364/552 |
| 5,583,797 | 12/1996 | Fluegge et al. | 364/552 |

*Primary Examiner*—Thomas P. Noland
*Attorney, Agent, or Firm*—Weingarten, Schurgin, Gagnebin & Hayes LLP

[57] ABSTRACT

A testing system with real time/off line functionality allocation is disclosed. The real time functions are limited to movement of objects to be tested through the testing stations, operation of sensors to gather raw data, and storage of the raw data. The off line functions include removing artifacts in the raw data, analyzing the raw data according to various rules, and controlling the sorting of the tested objects according to the analysis. By limiting the real time processing to a few essential elements necessary for operation of the testing line, the testing line can proceed even if the off line functions are not operating.

21 Claims, 2 Drawing Sheets

TESTING SYSTEM WITH REAL TIME/OFF LINE FUNCTIONALITY ALLOCATION

CROSS REFERENCE TO RELATED APPLICATIONS

This application is based on Provisional Application Ser. No. 60/013,214 filed on Feb. 26, 1996.

STATEMENT REGARDING FEDERALLY SPONSORED RESEARCH OR DEVELOPMENT

Not Applicable

BACKGROUND OF THE INVENTION

In manufacturing and other processes, an object is transported along a series of stations at which various processes occur, including the testing of objects being manufactured. For example, in the manufacture of semiconductor wafers, wafers are transported to one or more measurement stations at which parameters such as wafer flatness, thickness, microroughness, optical reflectivity, particulate and heavy metal contamination, and film thickness are measured. Processing steps include the sorting of wafers in accordance with measured and evaluated data and optionally the taking of corrective action, such as the removal of contaminants from wafers.

The testing and transport of the wafers through the testing station or stations is controlled by at least one processor operating in real time, shown generally in FIG. 1. For example, the processor(s) controls the movement of the wafers through the stations of the testing line, controls the operation of the test sensors, stores the raw data, evaluates the raw data, and updates the movement of the wafers in response to the data evaluation. These functions are all performed in real time, as the wafers are moving through the testing stations and other factory processes. An example of such a testing system is described in commonly assigned U.S. patent application Ser. No. 5,511,005.

BRIEF SUMMARY OF THE INVENTION

The present invention provides a process testing system in which functions are allocated between real time applications and off line applications with the off line applications independent from the real time applications and vice versa. The real time applications are limited to movement of objects to be tested, such as semiconductor wafers, through and within the testing stations, operation of the testers to gather raw data, and storage of the raw data. These functions are the minimum necessary to keep a test line moving. The off line applications include the analysis of the raw data, such as accessing selected data from the database of raw data, removing errors in the raw data, processing the selected raw data according to various rules, and comparing the processed data with models.

The off line applications allows the data analysis to occur independently of the operation of the test line. The data analysis processing functions are subject to more delays than the real time functions of moving the objects, controlling the testers, and storing the data. Also, the analysis functions are often updated, which requires stopping the processing, installing the updated software, and recertifying the system. By limiting the real time processing to a few essential elements necessary for operation of the test line, and providing the offline processing to be performed independently of the real time functions, the test line operations can proceed even if the analysis functions are not operating.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
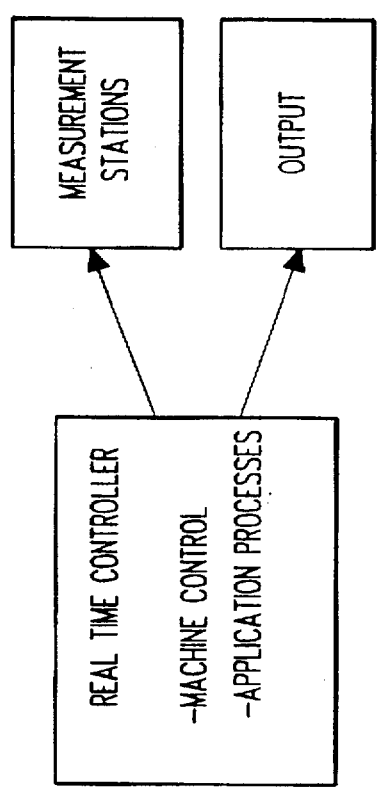
FIG. 1 is a block diagram of a prior art testing system.
Figure 2:
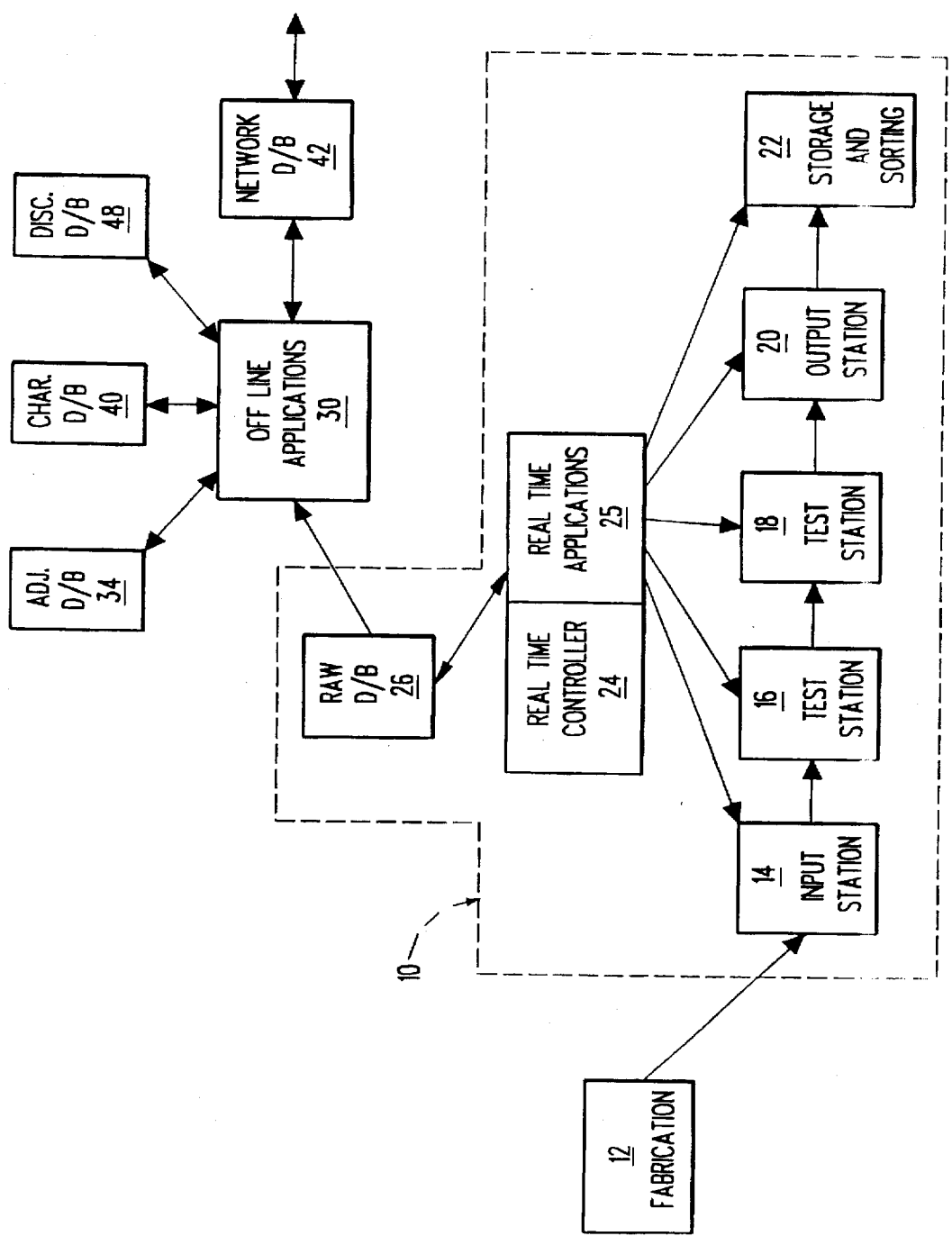
FIG. 2 is a block diagram of the testing system having real time and off line functionality allocation according to the present invention.

Referring to FIG. 2, an illustrative semiconductor wafer testing line 10 is shown in which a wafer input station 14 receives wafers from an initial fabrication process 12. The input station 14 conveys the wafers to testing stations 16, 18. The testing stations may include, for example, a flatness station or a resistivity station. After testing, the wafers are conveyed to an output station 20.

Suitable wafer conveying mechanisms, as are known in the art, are provided in the stations and between the stations for handling the wafers within each station and for conveying wafers between stations. The wafer conveying mechanisms are controlled by a real time controller 24 in conjunction with real time applications 25 to move the wafers through the stations 14, 16, 18, 20 and 22, and to control the operation of the stations 14, 16, 18, 20 and 22. The output station 20 conveys tested wafers to wafer storage and sorting apparatus 22 where tested wafers are stored for subsequent sorting and routing as discussed further below. The real time applications 25 are in communication with the wafer storage and sorting apparatus 22 to sort the wafers according to the wafer characterization data. The sorted wafers are then handled in the manner appropriate for their characterization, such as shipping to a customer or conveying to a contaminant removal station.

Data obtained by measurement probes in the testing stations 16, 18 are transmitted to the real time controller 24 through real time applications 25 and are stored in a raw measurements database 26. Minimum corrections are applied by the real time applications to the data to account, for example, for variable and constant artifacts, as are typically present in the data. Similarly, minimum analysis, such as wafer characterization, is done of the data by the real time applications 25.

Off line applications 30 are provided for various functions, such as correcting the data for artifacts, characterizing the wafers according to the results obtained, and transforming the data to provide different views. Toward this end, the off line applications 30 are in communication with the raw data base 26. The applications 30 access selected data and apply various rules to the data. The adjusted data is stored in a database 34 of adjusted data which can be used for further characterizing the wafers.

When testing stations 16 and 18 are upgraded, the software for correcting for artifacts generated by that testing station must also be upgraded. This software is part of the off line applications 30. In the present invention, the testing station can be placed on line before the upgraded correcting software is installed and certified. The certification process can then occur as wafers are being processed through the testing station. The raw data is generated and stored in the raw measurement database 26 until needed.

The off line applications 30 also analyze the corrected data in corrected database 34 to characterize the wafers according to specified wafer characterization rules. Toward this end, desired corrected data for a wafer from the corrected measurements database 34, which may be from several tests, is accessed by feature extractors as part of the off line applications 30. For example, to determine the existence of wafer dimples, data representative of wafer thickness and optical reflectivity may be extracted from the wafer database 34. The data is then combined by appropriate wafer characterization rules, also part of the off line applications, to provide a database 40 of wafer characterization data.

The off line applications are preferably in communication with a network 42, such as a factory-wide network. In this case, an operator or a networked controller can access the data for various purposes, such as monitoring and/or correcting the fabrication process.

Another functionality performed by the off line applications 30 are the comparison of the wafer characterization data to wafer models or fabrication process simulations by comparison rules which are also part of the off line applications 30. Discrepancies are accumulated in a discrepancy database 48. Such data is useful for gaining knowledge of the wafer fabrication process and can be used to control or correct the process. For example, reflectivity data may be analyzed to ascertain how effective a new wafer polisher is as part of the fabrication process.

According to the present invention, when software for a particular application, such as wafer characterization, is upgraded, the off line application is changed, but the real time controller and real time applications are not. Software upgrades can cause system failures and require time and effort to recertify the system. In this case, the real time controller 24 and real time applications are not affected by the upgrade, and thus the testing process is not interrupted. The off line applications 30 can be recertified as needed independently of the testing process.

An additional advantage of the present invention derives from the decoupling of the testing line 10 and the off line applications 30. During testing under the control of prior art controllers, the generation of certain data by analysis can lead to a failure indication and cause the testing line to shut down. In the present invention, analysis of the data is done off line. The testing line is decoupled from the off line applications and no shut down is permitted.

Hitherto, it has been thought desirable to perform as much data analysis as possible in real time to speed the sorting of the wafers into appropriate categories. Applicants have found that the advantages of minimized down time in the testing process realized by the present invention outweigh the advantages gained by speeding up the acquisition of knowledge regarding wafer characteristics. Furthermore, with the present invention, wafer storage time is often minimal since the off line applications frequently can run simultaneously with the real time applications. During those times that the off line applications are not active, the testing process can continue to run and recertifications can proceed more efficiently.

A sample wafer test process according to the present invention occurs as follows. The test process is similar to that described in U.S. Pat. No. 5,511,005 of the assignees of the present application and incorporated herein by reference, however the test process of the present application includes the functionality of independent off line and real time applications for testing wafers.

A real time controller, running real time applications controls the introduction of a plurality of wafers into an input station from a fabrication process 12. The real time applications 25 direct the input station 14 to provide at least one wafer to a first test station 16. While FIG. 2 shows two test stations 16 and 18, it should be appreciated that any number of test stations could be utilized. The test stations operate under the control of the real time applications to provide data relating to various aspects of the wafer being tested. Such aspects include, but are not limited to, wafer flatness, wafer thickness, micro-roughness, optical reflectivity, particulate and heavy metal contamination, film thickness, material type, wafer bow and wafer warp. The measurement of wafer bow and warp may be performed as recited in U.S. Pat. No. 4,750,141 of the assignee of the present invention and incorporated herein by reference. The measurement of wafer flatness may be performed as described in U.S. Pat. No. 4,860,229 of the assignee of the present invention and incorporated herein by reference. The data resulting from the testing of the wafers by the test stations is stored in the raw database 26. This stored data is available to the off line applications 30 for further processing independently from and transparent to the real time controller 24 and real time applications 25.

The off line applications 30 may be used for example to indicate the presence of any dimples on all or a determined subset of wafers which have been through the testing process. Since these wafers have made their way through the testing process, data relating to these wafers which has been acquired by the testing stations 16, 18 resides in the raw database 26. The off line applications 30 analyze the information relating to, for example, the thickness measurement and the optical reflectivity measurement which are indicative of the potential presence of dimples on a wafer. This determination happens independently of the real time applications, and while the determination of dimples in prior tested wafers is occurring, additional wafers could be going through the test process.

Although the invention has been particularly described in conjunction with a semiconductor wafer testing process, the real time/off line functionality allocation provided by the present invention is applicable to the testing of other objects.

Having described preferred embodiments of the invention, it will be apparent to one of skill in the art that other embodiments incorporating their concepts may be used. Accordingly, the invention should be limited only by the spirit and scope of the appended claims.

What is claimed:

1. A testing system comprising:

a plurality of real time applications controlling a plurality of real time functions;

a real time controller operative with said plurality of real time applications;

a plurality of off line applications controlling a plurality of off line functions independently of said real time functions;

a first test station in communication with said plurality of real time applications; and a first database in communication with said plurality of real time applications and said plurality of off line applications, wherein said real time applications are selected from the group consisting of movement of objects being tested to or from said first test station, operation of said first test station for objects being tested, and storage within said first database of data obtained by testing objects on said first test station.

2. The testing system of claim 1 wherein said off line applications are selected from the group consisting of analysis of data in said first database, removal of errors in data of said first database, comparison of processed data to a model, update of processing applications, creation of application processes, characterization of objects, sorting of objects, correction of an object fabrication process, and control of an object fabrication process.

3. The testing system of claim 1 further comprising a second database in communication with at least one of said plurality of off line applications.

4. The testing system of claim 1 further comprising a network operative with said off line applications.

5. The test system of claim 1 further comprising a second test station in communication with said plurality of real time applications.

6. The testing system of claim 1 wherein said movement of objects being tested to or from said first test station comprises a conveyor control system.

7. The testing system of claim 1 wherein said movement of objects being tested to or from said first test station comprises a robot control system.

8. A semiconductor wafer testing system comprising:

a plurality of real time applications controlling a plurality of real time functions;

a real time controller operative with said plurality of real time applications;

a plurality of off line applications controlling a plurality of off line functions independently of said real time functions;

a first wafer test station in communication with said plurality of real time applications; and a first database in communication with said plurality of real time applications and said plurality of off line applications.

9. The semiconductor wafer testing system of claim 8 wherein said real time controller applications are selected from the group consisting of movement of wafers being tested to and from said first wafer test station, operation of said first wafer test station for wafers being tested, and storage within said first database of data obtained by testing wafers at said first wafer test station.

10. The semiconductor wafer testing system of claim 9 wherein said movement of wafers being tested to or from said first wafer test station comprises a conveyor control system.

11. The semiconductor wafer testing system of claim 9 wherein said movement of wafers being tested to or from said first test station comprises a robot control system.

12. The semiconductor wafer testing system of claim 8 wherein said off line applications are selected from the group consisting of analysis of data in said first database, removal of errors in data of said first database, comparison of processed data to a model, update of processing applications, creation of application processes, characterization of wafers, sorting of wafers, correction of a wafer fabrication process, and control of a wafer fabrication process.

13. The semiconductor wafer testing system of claim 8 further comprising a second database in communication with at least one of said plurality of off line applications.

14. The semiconductor wafer testing system of claim 8 further comprising:

a wafer input station in communication with said real time applications and said first wafer test station.

15. The semiconductor wafer testing system of claim 8 further comprising an output station in communication with said real time applications and said first wafer test station.

16. The semiconductor wafer testing system of claim 8 further comprising a wafer storage and sorting system in communication with said real time applications.

17. The semiconductor wafer testing system of claim 8 further comprising a second wafer test station in communication with said real time applications.

18. The semiconductor wafer testing system of claim 8 further comprising a corrected data database in communication with said off line applications.

19. The semiconductor wafer testing system of claim 8 further comprising a characterization database in communication with said off line applications.

20. The semiconductor wafer testing system of claim 8 further comprising a discrepancy database in communication with said off line applications.

21. The semiconductor wafer testing system of claim 8 further comprising a network operative with said off line applications.

* * * * *